United States Patent [19]

Drage

[11] Patent Number: 4,590,042
[45] Date of Patent: May 20, 1986

[54] PLASMA REACTOR HAVING SLOTTED MANIFOLD

[75] Inventor: David J. Drage, Sebastopol, Calif.

[73] Assignee: Tegal Corporation, Novato, Calif.

[21] Appl. No.: 685,650

[22] Filed: Dec. 24, 1984

[51] Int. Cl.$^4$ .................. B01J 19/08; C23C 14/00; C23F 1/02

[52] U.S. Cl. .................. 422/186.06; 422/186.05; 422/186.04; 204/298; 204/192 E; 156/345

[58] Field of Search .................. 422/186.05, 186.06, 422/186.29; 156/345; 204/298, 192 E

[56] References Cited

U.S. PATENT DOCUMENTS

| | | | |
|---|---|---|---|
| 4,209,357 | 6/1980 | Gorin et al. | 422/186.05 |
| 4,313,783 | 2/1982 | Davies et al. | 204/298 X |
| 4,534,816 | 8/1985 | Chen et al. | 156/345 |

FOREIGN PATENT DOCUMENTS

| | | | |
|---|---|---|---|
| 0086119 | 6/1980 | Japan | 156/345 |
| 0004028 | 1/1984 | Japan | 156/345 |

Primary Examiner—John F. Terapane
Assistant Examiner—Susan Wolffe
Attorney, Agent, or Firm—Paul F. Wille

[57] ABSTRACT

A plasma reactor apparatus is disclosed in which plates having channels are used to redistribute gas uniformly over the surface of a wafer being processed in the reactor. Slot means adjacent the plates provide a final baffle to prevent jetstreams in the gas from impinging directly on the wafer.

13 Claims, 7 Drawing Figures

PLASMA REACTOR HAVING SLOTTED MANIFOLD

BACKGROUND OF THE INVENTION

This invention relates to plasma reactor chambers and, in particular, to a plasma reactor chamber having a slotted manifold plate.

Plasma processing is finding increasing use in the semiconductor industry, not only for "ashing" or the removal of photoresist but also for the highly selective etching of a variety of layers. Further, plasma processing can be used for depositing layers as well.

As these processes become more widely used and as the dimensional requirements of semiconductor devices become smaller and smaller, uniformity across the wafer becomes a critical factor in determining yield. Further, there must be uniformity or reproducibility from wafer to wafer.

In the past, uniformity has been improved, as disclosed in U.S Pat. No. 4,209,357, by providing a gas manifold having a plurality of apertures located across the face thereof for supplying the reactive gas or gas mixture at a plurality of sites across the surface of the wafer. In addition, a plurality of vacuum ports are provided for exhausting reaction products from the chamber.

In this arrangement, supply and exhaust apertures alternated across the surface of the chamber in somewhat of a checkerboard pattern. While improving the availability of active species for reaction at the surface of the wafer, the flow of gases through the apertures formed a plurality of jets, so that pressures and flows had to be carefully adjusted to avoid a waffle-shaped reaction pattern.

An alternative to this is to provide what is known as a radial flow plasma reactor. In this configuration, reactive gases are supplied through a plurality of apertures in the central regions of the reactor, while gases are exhausted through an annular exhaust port which surrounds the gas supply apertures. In this configuration, the flow of gases is sufficiently non-uniform that the reaction is non-uniform. In particular, gases at the central region of the wafer are relatively stagnant compared to gases at the edge of the wafer, adjacent the exhaust port. As a result, active species are more readily depleted at the center than at the edge.

To a large extent, this problem and the preceding problem can be obviated by the careful choice of pressure, gas flow, and applied RF power. Unfortunately, this is more true for smaller wafers than for larger wafers, e.g. wafers having a diameter or largest dimension of 125 mm. or greater.

In view of the foregoing, it is therefore an object of the present invention to provide a plasma reactor having improved uniformity of gas delivery and exhaust.

It is another object of the present invention to provide a gas manifold plate having reduced resistance to gas flow.

It is a further object of the present invention to provide a gas manifold for a plasma reactor having low gas velocity adjacent the manifold.

SUMMARY OF THE INVENTION

The foregoing objects are achieved in the present invention wherein the gas supply and exhaust structure comprises intersecting slots and bores which combine to form alternating slots for supplying and exhausting gases from the region adjacent the wafer. In addition, the path for the gas through the gas supply and exhaust structure is non-linear, thereby preventing any jets of gas from impinging directly onto the wafer, i.e. the gas flow is turbulent.

A more complete understanding of the present invention can be obtained by considering the following detailed description in conjunction with the accompanying drawings, in which.

Figure 1:
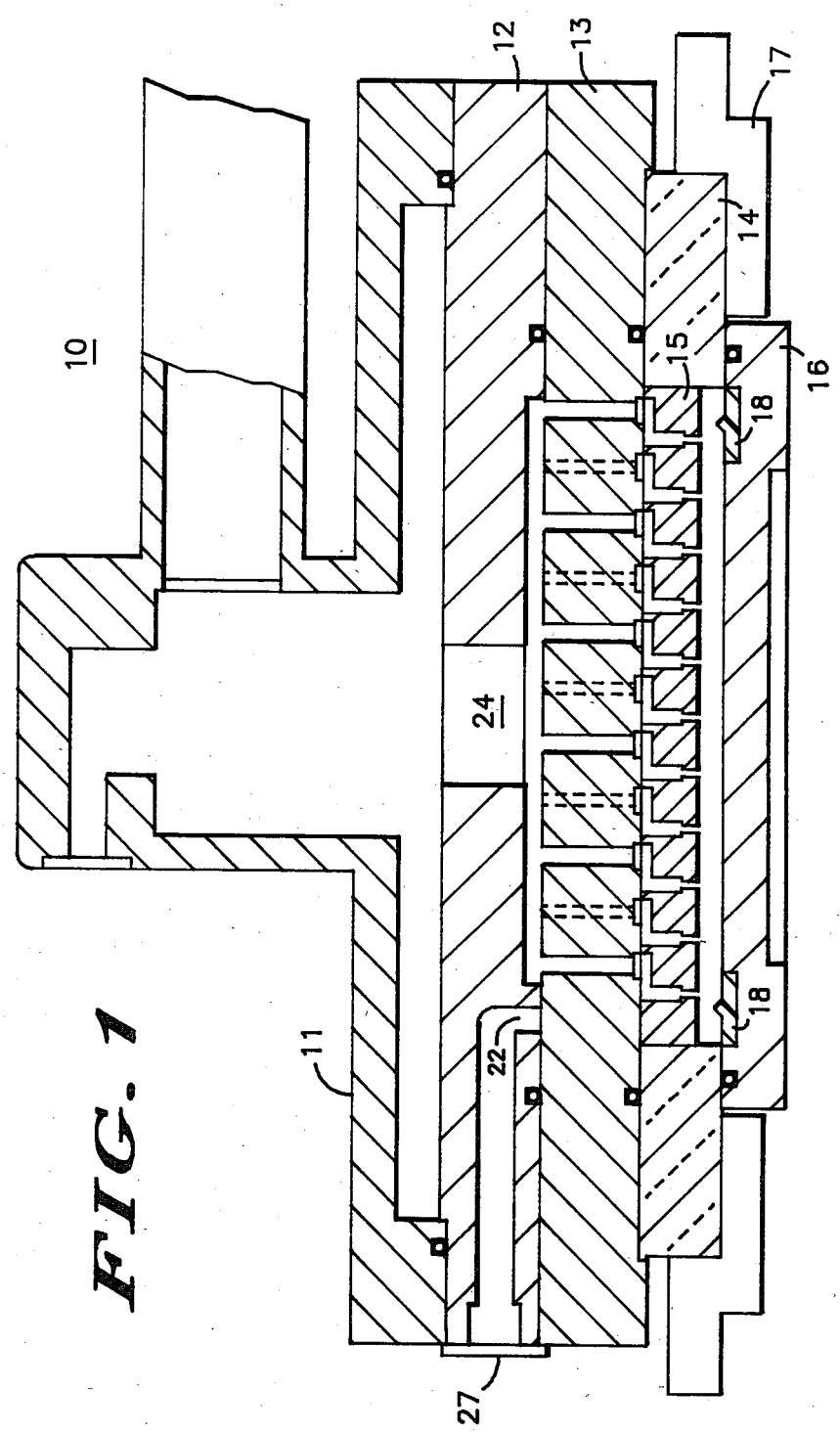
FIG. 1 illustrates a plasma reactor in accordance with a preferred embodiment of the present invention.

As illustrated in FIG. 1, plasma reactor 10 comprises an exhaust plate 11 which forms the upper portion of the reactor and contains a plenum and suitable fittings for connection to an exhaust system (not shown). Exhaust plate 11 typically comprises aluminum and may consist of several pieces, rather than a single piece as illustrated in FIG. 1. Connected to exhaust plate 11 is manifold plate 12 which comprises a plurality of bores, for gas supply and exhaust. Manifold plate 12 is illustrated in more detail in FIG. 2. Positioned beneath manifold plate 12 is distribution plate 13 which serves to redirect the flow of gas over the entire surface of the wafer and at a relatively uniform pressure. Positioned beneath distribution plate 13 are ceramic ring 14 and slot means 15.

Ceramic ring 14 provides electrical isolation between the upper electrode, formed by slot means 15 and distribution plate 13, and the lower electrode, formed by wafer chuck 16. Ceramic ring 14 surrounds slot means 15 which may comprise a single piece of machined aluminum or a plurality of machined strips to form the passageways contained therein, and which are described in greater detail in connection with FIG. 4. The passageways of slot distribution plate 13. Wafer chuck 16, which is typically connected to a source of RF power while the remainder of the reactor is grounded, is attached to mounting ring 17 by any suitable means (not shown) not shown in FIG. 1 are various sealing means, such as O-rings well known per se to those of skill in the art.

When wafer chuck 16 is positioned as illustrated in FIG. 1 one obtains what is known as a small gap plasma reactor in which a wafer is positioned upon chuck 16 by insulating means 18 and is positioned very closely to slot means 15. As known per se in the art the operation of reactor 10 comprises pumping down the chamber formed between slot means 15 and wafer chuck 16, providing a suitable gas at reduced pressure while continuously evacuating the chamber, and providing a radio frequency signal of from several tens to a few hundred watts to the system by way of wafer chuck 16. In the resultant glow discharge, reactive species are formed which etch the desired portion of the wafer positioned therein.

In accordance with the present invention, two improved results are obtained as a result of the construction of the various plates as illustrated in FIG. 1. The first is the substantial elimination of a stagnant zone in the supply of the gas to the vicinity of the wafer. A second is the improved uniformity in the flow of the gas across the surface of the wafer. Non-uniform gas flow tends to result from the fact that the apertures adjacent the supply are at slightly higher pressure than more remote apertures due to the resistance to the flow of the gas throughout the chamber. In accordance with the present invention, the various bores and slots combine to produce manifolds in which the pressure of the gas is substantially more uniform throughout the manifold.

Figure 2:
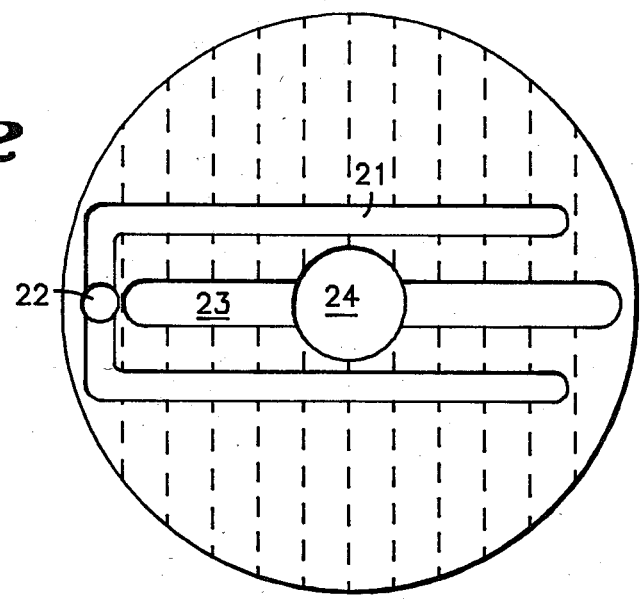
FIG. 2 illustrates a manifold plate in accordance with the present invention.

This is illustrated for example in FIG. 2 wherein manifold plate 12 comprises an elongated "U" shaped slot 21 having it bore 22 formed therein for connection to a suitable source of gas by way of fitting 27, as illustrated in FIG. 1. Bore 24 is formed through manifold plate 12 and connects with the chamber formed within exhaust plate 11. Also formed in the underside of manifold plate 12 is slot 23 which acts as a collection manifold from the various bores in distribution plate 13. The dashed, vertical lines in FIG. 2 illustrate the approximate location of the slots adjacent the wafer within the reactor.

Figure 3:
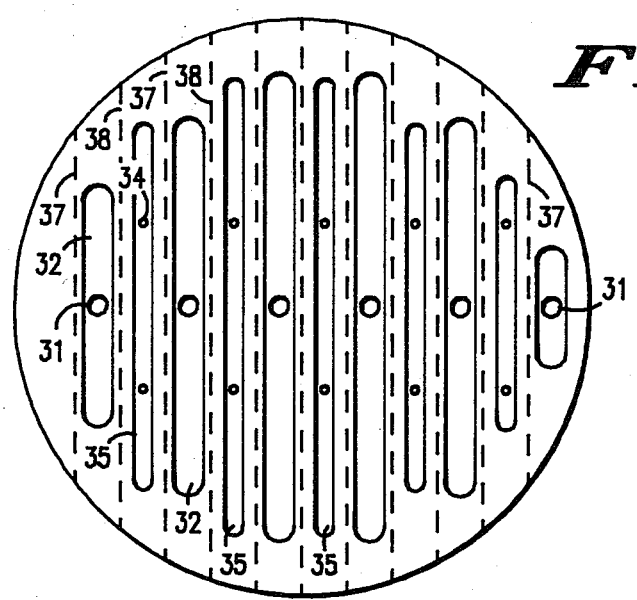
FIG. 3 illustrates a distribution plate in accordance with the present invention.

FIG. 3 illustrates the lower surface of distribution plate 13 in the vicinity of the wafer. Distribution plate 13 comprises a plurality of bores 31 which communicate with slot 23 in manifold plate 12 to provide a path for the exhaust gases from the reactor. These bores are formed in a plurality of slots 32 which provide a low resistance path in which the gas may flow. Similarly, bores 34 are formed in distribution plate 13 and communicate with slot 21 in manifold plate 12. Bores 34 are, in effect, substantially enlarged into slots 35 extending across the surface of distribution plate 13. This not only has the effect of substantially reducing the resistance to the flow of gas, it has the additional effect of increasing the turbulence of the gas flow and providing a more uniform pressure for the gas within adjacent the wafer during processing.

FIG. 3 also contains a plurality of vertical, dashed lines alternately numbered 37 and 38. Lines 37 correspond approximately to exhaust slots in slot means 15, while dashed lines 38 correspond approximately to the gas supply slots in slot means 15. It is preferred that an odd number of slots be provided and that the exhaust slots form the outermost slots of the set. This helps to contain the plasma and, more importantly, to contain the by-products of the reaction, thereby making it more likely the by-products will be collected rather than deposit on the interior of the reactor.

As can be seen by aligning the dashed vertical lines in FIGS. 2 and 3, the slots in manifold plate 12 and distribution plate 13 intersect; specifically, they are orthogonal. The slots on each plate do not touch however. If the channels are considered as formed in the front surface of the respective plates, then the front surface of manifold plate 12 touches the back surface of distribution plate 13. The surfaces are interconnected by a plurality of bores.

Figure 4:
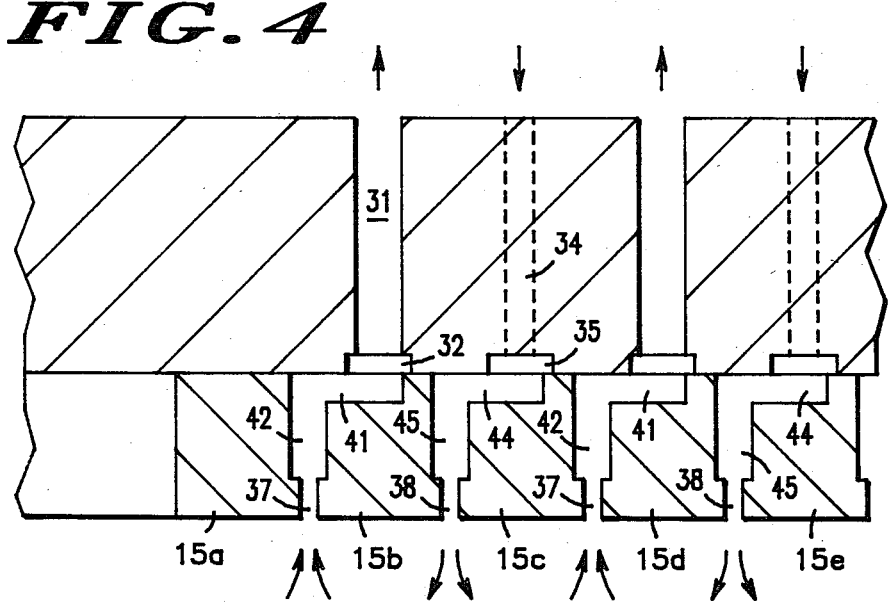
FIG. 4 illustrates a detail of the plasma reactor showing the path of the gas through the slots adjacent the wafer.

The relationship of the various bores and slots is better illustrated in FIG. 4 wherein slot means 15 is illustrated as comprising a plurality of separate pieces numbered 15a-15e. As illustrated in FIG. 4, bore 31 provides a path for exhausting gases and is connected to slot 32. Adjacent slot 32 is slot 41 formed in strip 15b. Strips 15a and 15b are separated by a predetermined amount to form slot 37. Slot 37 opens into channel 42 which is formed in the side of strip 15a and terminates adjacent slot 41 in strip 15b. Thus gas is exhausted from the region adjacent the wafer by way of slot 37, channel 42, slot 41, slot 32, and bore 31. A similar path, terminating at slot 38, is taken by the gases being supplied to the region adjacent the wafer. The purpose of this arrangement is two-fold. A first is to prevent direct access to the wafer from a supply bore, thereby eliminating a jet of reactant gases from blowing directly onto the wafer. A second purpose is to further equalize the pressure and flow of the gas, by way of channel 45, just prior to exiting slot means 15 by way of slot 38.

Slot 37 is typically 0.13-0.25 mm (0.005-0.010 inches) wide. The width, while not a critical dimension, is subject to some restrictions. It must be wide enough to be effective, yet not so wide as to cause the hollow cathode effect. This effect arises in plasma systems where there is an aperture or opening. Edge effects cause an enhanced electron density and an intense glow discharge. This can, and usually does, lead to sputtering. If the opening is small, this effect does not occur. In reactors operating at a pressure of 0.27-0.67 kPa (2.0-5.0 torr), openings should be less than 0.38 mm (0.015 inches) in diameter. The maximum diameter varies inversely with pressure and is readily determined experimentally.

Figure 5:
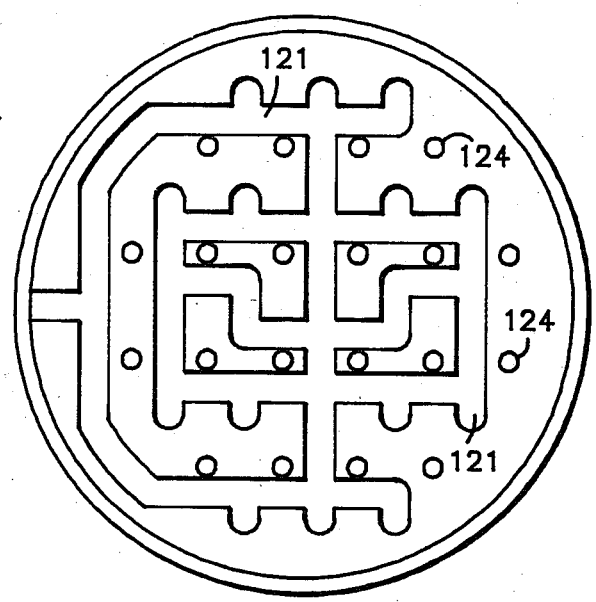
FIG. 5 illustrates an alternative embodiment of a manifold plate.

FIG. 5 illustrates an alternative embodiment of a manifold plate in accordance with the present invention. This embodiment differs from that of FIG. 2 in that channel 121 forms a labyrinth to equalize the pressure of the gas supply over the area of the wafer. Since direct line bores for exhaust do not cause a problem at the surface of the wafer, there is no exhaust channel. Instead, a plurality of bores 124 extend through the manifold plate to connect corresponding bores in the distribution plate to the plenum formed by exhaust plate 11, FIG. 1.

Figure 6:
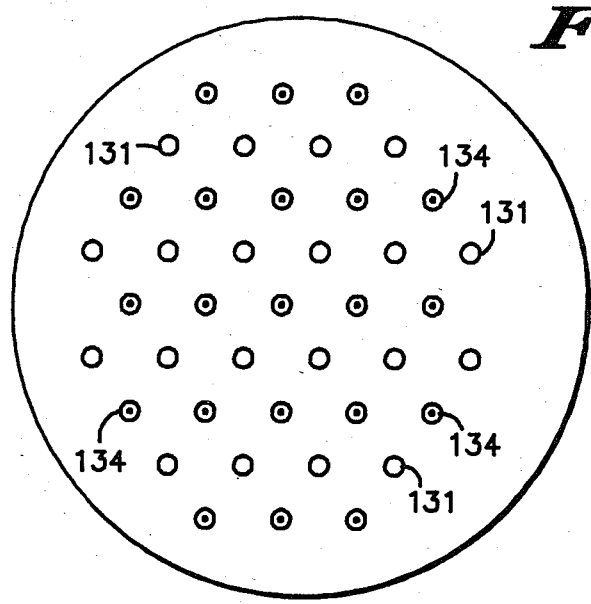
FIG. 6 illustrates an alternative embodiment of a distribution plate.

In this embodiment of the present invention, the distribution plate comprises a plurality of bores, as illustrated in FIG. 6. Specifically, inlet or supply bores 134 are located in an array corresponding to respective locations along channel 121. Exhaust bores 131 are located in an array corresponding to exhaust bores in the manifold plate.

Figure 7:
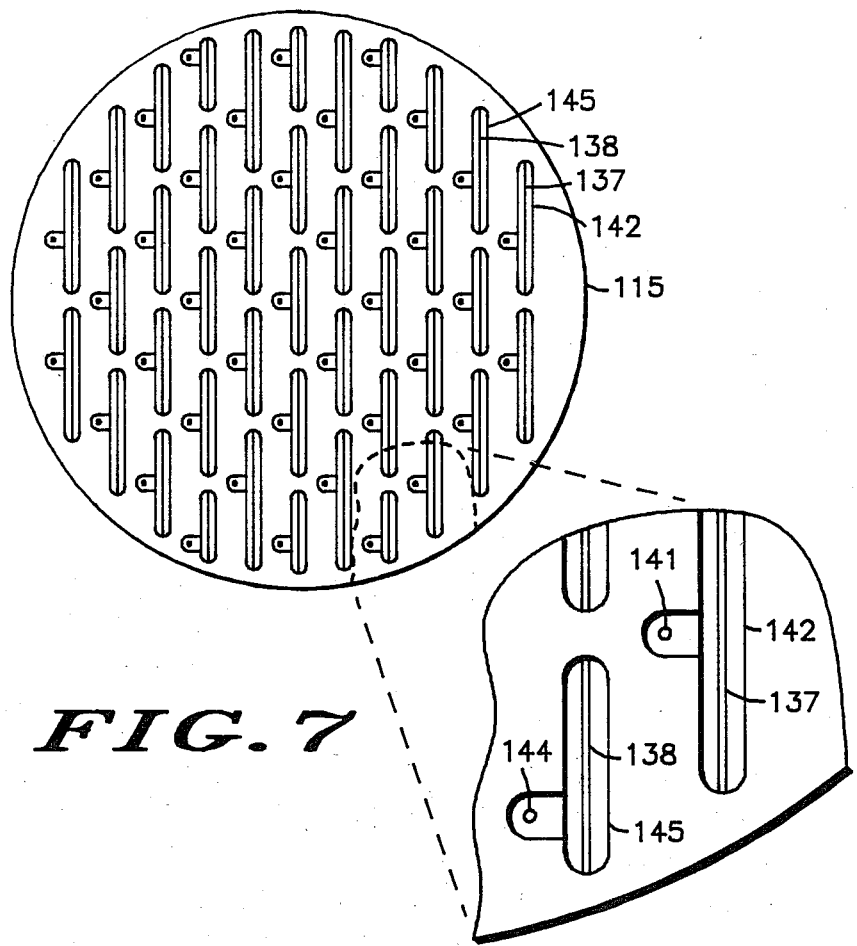
FIG. 7 illustrates an alternative embodiment of a slot means.

As illustrated in FIG. 7, slot means 115 comprises a plurality of supply channels 145 interconnecting offset slot 144 and slot 138. Similarly, exhaust channel 142 interconnects offset slot 141 and slot 137. Offset slot 144 is located beneath bore 134 in the distribution plate. Offset slot 141 is located beneath bore 131 in the distribution plate.

As can be understood by those of skill in the art, offset slot 141 is not necessary since it is in the exhaust part of the system. If eliminated, channel 142 would be located directly below bore 131.

A plasma reactor constructed in accordance with the embodiment of FIGS. 5-7 operates as described above. The channel in the manifold plate equalizes pressure across the surface of the wafer and the offset channels and supply channels prevent jets of reactive gas from impinging directly on the wafer.

By obviating jetstreams and eliminating pressure differentials across the surface of the wafer, one obtains a much more uniform supply of reactive species. Having a relatively uniform supply of reactive species, in turn, reduces the restrictions on the level of the applied power of the plasma thereby enabling one to obtain more processing freedom as well as greater uniformity in a defined process. As previously indicated, uniformity is increasingly difficult to obtain in plasma reactors of the prior art as wafer size increases. Utilizing a reactor in accordance with the present invention, wherein a silicon dioxide layer was etched, one obtained five percent uniformity on a wafer having a diameter of 150 mm. Utilizing plasma reactors of the prior art it is extremely difficult to obtain five percent uniformity on wafers of 125 mm. diameter. Typically one obtains the non-uniform etching described above as the result of non-uniform flow of gases. Further, the five percent uniformity obtained with prior art apparatus required careful balancing of pressure flow and applied power. In accordance with the present invention, the restrictions on these parameters are somewhat loosened because of the uniformity provided by the structure of the apparatus, even when processing wafers having 44 percent greater area.

Having thus described the present invention, it will be apparent to those of skill in the art that various modifications can be made within the spirit and scope of the present invention. For example, as previously indicated, slot means 15 can comprise a plurality of strips fastened to distribution plate 13 or slot means 15 can comprise a plurality of slots machined in the distribution plate or in a separate plate. While it is preferred that the various components be fabricated from aluminum, it is is not required that only aluminum be used. Any electrically conductive material can be used. While slot means 15 is illustrated in FIG. 4 as comprising slots adjacent the slots in distribution plate 13, such is not required, merely preferred. It is required, however, that slot 38 not be positioned directly underneath bore 34 or slot 35. Slot 38 is offset to prevent any jetstream of gas and to assure a turbulent flow. Providing a direct or straight line path through distribution plate 13 and slot means 15 would not prevent the formation of a jet of gas impinging on the wafer. While illustrated as comprising straight lines, the various slots can be curved, e.g. in the form of concentric rings.

I claim:
1. A plasma reactor comprising:
   a gas manifold plate having a first slot for supplying gas and a second slot for exhausting gas;
   a distribution plate having a plurality of gas supply slots and a plurality of gas exhaust slots,
   said plates being in contact with each other with the slots of one plate not being parallel to the slots in the other plate.

2. The apparatus as set forth in claim 1 wherein said plates each have first and second major surfaces, said slots are formed in the first major surface of each plate, and the first major surface of said gas manifold plate faces the second major surface of said distribution plate.

3. The apparatus as set forth in claim 2 wherein the slots of one plate are orthogonal to the slots of the other plate.

4. The apparatus as set forth in claim 3 wherein said distribution plate comprises a plurality of bores from one major surface to the other for interconnecting respective slots of the plates.

5. The apparatus as set forth in claim 2 wherein said distribution plate comprises slot means attached to the first major surface thereof.

6. The apparatus as set forth in claim 5 wherein said slot means at least partially overlies the slots in said distribution plate for re-directing the flow of gas from said distribution plate.

7. The apparatus as set forth in claim 6 wherein said slot means comprises the same number of slots as there are slots in said distribution plate.

8. The apparatus as set forth in claim 7 wherein the slots in said slot means are narrower than the slots in said distribution plate.

9. The apparatus as set forth in claim 2 wherein the slots in said distribution plate comprises interleaved supply and exhaust channels.

10. The apparatus as set forth in claim 1 wherein there are an odd number of slots in said distribution plate and the number of exhaust slots exceeds the number of gas supply slots.

11. A plasma reactor comprising:
    a gas manifold plate having first and second major surfaces and a slot formed in said first major surface for supplying gas to a plurality of locations across said first major surface;
    a distribution plate having first and second major and a plurality of bores extending through said plate from one major surface to the other;
    said plates being in contact with each said bores with said locations; and
    slot means on said distribution plate for deflecting the gas streams from said bores.

12. The apparatus as set forth in claim 11 wherein said slot means comprises:
    a plurality of slots located in offset relationship the bores in said distribution plate.

13. The apparatus as set forth in claim 12 wherein said plurality of slots in said slot means comprises straight line segments.

* * * * *